(12) United States Patent
Bixler et al.

(10) Patent No.: US 6,494,724 B1
(45) Date of Patent: Dec. 17, 2002

(54) ELECTRICAL CONNECTOR WITH TERMINAL TAIL ALIGNING DEVICE

(75) Inventors: Craig A. Bixler, Elmhurst, IL (US); Susan M. Reed, Naperville, IL (US); Manqian Wang, Darien, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/969,840

(22) Filed: Oct. 2, 2001

(51) Int. Cl.$^7$ ............................................. H01R 12/00
(52) U.S. Cl. ............................................................ 439/79
(58) Field of Search ................................ 439/79, 541.5, 439/83, 876, 607

(56) References Cited

U.S. PATENT DOCUMENTS

| | | | |
|---|---|---|---|
| 5,167,531 A | * 12/1992 | Broschard et al. | 439/541.5 |
| 5,252,080 A | * 10/1993 | Pesson | 439/79 |
| 5,468,154 A | 11/1995 | Yip et al. | 439/79 |
| 5,533,901 A | 7/1996 | Hunt et al. | 439/79 |
| 5,540,598 A | 7/1996 | Davis | 439/79 |
| 5,591,036 A | 1/1997 | Doi et al. | 439/79 |
| 5,658,155 A | 8/1997 | McFarlane et al. | 439/79 |
| 5,692,912 A | 12/1997 | Nelson et al. | 439/79 |
| 5,711,678 A | 1/1998 | Wu | 439/79 |
| 5,722,839 A | 3/1998 | Yeh | 439/79 |
| 5,921,789 A | 7/1999 | Makino et al. | 439/79 |
| 5,947,769 A | * 9/1999 | Leonard et al. | 439/607 |
| 5,957,705 A | 9/1999 | David et al. | 439/79 |
| 5,971,774 A | 10/1999 | Kuki et al. | 439/79 |
| 6,012,930 A | 1/2000 | Tokuwa et al. | 439/79 |
| 6,022,227 A | 2/2000 | Huang | 439/79 |
| 6,077,092 A | * 6/2000 | Chiu et al. | 439/79 |
| 6,093,033 A | * 7/2000 | Kuki et al. | 439/79 |
| 6,095,853 A | 8/2000 | Huang et al. | 439/541.5 |
| 6,116,919 A | * 9/2000 | Tung | 439/79 |
| 6,159,040 A | 12/2000 | Chang et al. | 439/541.5 |
| 6,162,068 A | 12/2000 | Wu | 439/79 |
| 6,171,116 B1 | 1/2001 | Wicks et al. | 439/79 |
| 6,183,270 B1 | 2/2001 | Huang et al. | 439/79 |
| 6,273,732 B1 | * 8/2001 | Johnescu et al. | 439/79 |
| 6,287,146 B1 | * 9/2001 | Avery et al. | 439/607 |
| 6,302,710 B1 | * 10/2001 | Wang et al. | 439/79 |
| 6,354,875 B1 | * 3/2002 | Wu | 439/607 |

* cited by examiner

Primary Examiner—Gary Paumen
Assistant Examiner—Felix O. Figueroa
(74) Attorney, Agent, or Firm—Stephen Z. Weiss

(57) ABSTRACT

An electrical connector assembly is provided for mounting on a printed circuit board. The assembly includes a housing having a front mating face, a rear face and a board mounting face. A plurality of terminals are mounted on the housing and include contact portions extending toward the front mating face and tail portions extending at an angle to the contact portions for connection to the printed circuit board. A tail aligner is mounted on the tail portions of the terminals and is free of the housing spaced rearwardly of the rear face thereof. A cover at least partially encloses the rear face of the housing and the tail portions of the terminals. The cover is secured to the housing and is latched to the tail aligning device.

26 Claims, 2 Drawing Sheets

US 6,494,724 B1

ELECTRICAL CONNECTOR WITH TERMINAL TAIL ALIGNING DEVICE

FIELD OF THE INVENTION

This invention generally relates to the art of electrical connectors and, particularly, to an electrical connector assembly which includes a separate terminal tail aligning device.

BACKGROUND OF THE INVENTION

A known type of input/output (I/O) electrical connector includes an elongated dielectric housing having a front mating face and a rear face, with a plurality of terminal-receiving passages extending therebetween. A plurality of terminals are received in the passages. Each terminal includes a forwardly projecting contact portion and a rear portion projecting rearwardly of the housing beyond the rear face thereof. Often, the connector is a right angle I/O connector, with the housing having a bottom board mounting face. The terminals have tail portions extending at an angle to the contact portions and the rearwardly projecting portions, for soldering to conductive circuit traces on a printed circuit board. In order to maintain the exact position of the terminal tails prior to mounting the connector on the printed circuit board and to generally protect the tails, tail aligners typically are used in connection with such connectors. These tail aligners generally have a plurality of rows of holes through which the tails of the terminals extend. The tail aligner may be integral with the connector housing, but many connectors include some type of means for securing a separate tail aligner to the connector housing.

Problems still continue to plague such connectors which are mounted on printed circuit boards and which use tail aligners to facilitate soldering the tails to the circuit traces on the printed circuit board. One of the problems is to dissipate the heat generated during the soldering process. In particular, when the terminal pins are inserted into holes in the printed circuit board, a pin-in-hole reflow (PIHR) soldering process is used which generates considerable heat. Tail aligners and connector structures of the prior art, particularly where the tail aligner is mounted directly to the connector housing, do not allow for sufficient air flow to dissipate the heat during the PIHR soldering process. The heat can become so severe that the connector components, typically fabricated of plastic material, can melt or at least deform. The present invention is directed to solving these problems by providing a connector assembly with a tail aligner which is free and spaced from the connector housing, in conjunction with a ventilating cover or bracket for securing the tail aligner to the housing.

SUMMARY OF THE INVENTION

An object, therefore, of the invention is to provide a new and improved electrical connector assembly for mounting on a printed circuit board and which includes a terminal tail aligning device.

In the exemplary embodiment of the invention, the connector assembly includes a dielectric housing having a front mating face, a rear face and a board mounting face. A plurality of terminals are mounted on the housing and include contact portions extending toward the mating face of the housing, rear portions projecting from the rear face and tail portions extending at an angle to the contact portions past the board mounting face of the housing. A tail aligning device has a plurality of apertures through which the tail portions of the terminals extend. The tail aligning device is press-fit onto the tail portions and is free of the housing and spaced rearwardly of the rear face thereof. A cover at least partially encloses the rear face of the housing and the rear portions of the terminals. Complementary interengaging securing means are provided between the cover and the housing to hold the cover on the housing. Complementary interengaging latch means are provided between the cover and the tail aligning device to hold the tail aligning device to the cover.

According to one aspect of the invention, the tail aligning device is located on the tail portions of the terminals above the board mounting face of the housing and, therefore, above the printed circuit board. This allows for air to flow completely around the tail aligning device which is free and spaced from the housing. The cover is a ventilating device and is perforated to allow the passage of air therethrough.

According to another aspect of the invention, the cover is generally U-shaped in an inverted orientation to define a top bridge portion and depending leg portions at opposite ends of the bridge portion. The cover includes holes in the bridge portion and in the leg portions to allow the passage of air therethrough. The complementary interengaging latch means are between the leg portions of the cover and opposite ends of the tail aligning device. The complementary interengaging securing means include interengaging securing components between the bridge portion of the cover and the housing. In addition, securing components are provided between the leg portions of the cover and the housing, in the form of interengaging rib-and-groove means for slidably mounting the cover onto the housing. The rib-and-groove means include a detent latch boss in a groove engageable with a detent latch shoulder on a rib of the housing.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
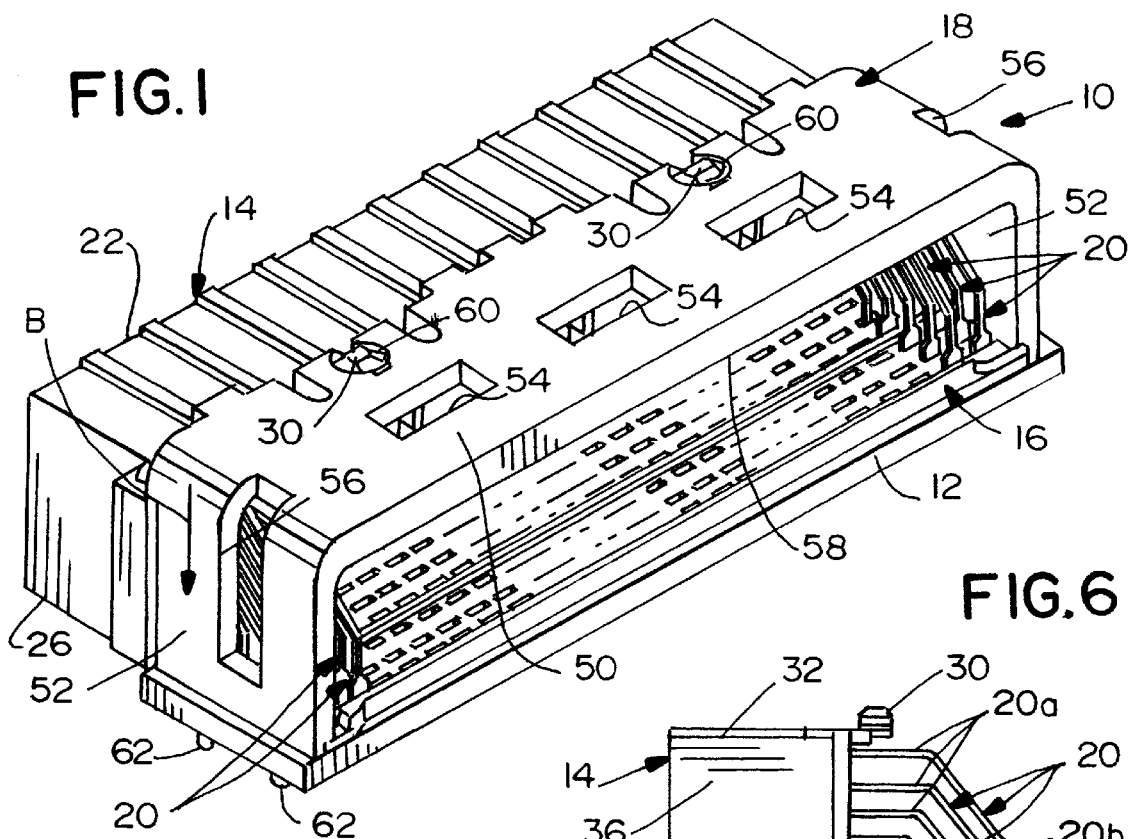
FIG. 1 is a rear perspective view of an electrical connector assembly according to the invention, mounted on a printed circuit board.

Referring to the drawings in greater detail, and first to FIG. 1, the invention is embodied in an electrical connector assembly, generally designated 10, which is designed for mounting on a printed circuit board 12. The connector assembly includes three major components, namely: a dielectric housing, generally designated 14; a tail aligning device or tail aligner, generally designated 16; and a ventilating cover, generally designated 18, along with a plurality of conductive terminals, generally designated 20.

The use of such terms as "top", "bottom", "front", "rear" and the like herein and in the claims hereof are not in any way intended to be limiting. Such terms are used to provide a clear and concise understanding of the invention in relation to the orientation of connector assembly 10 on printed circuit board 12 as shown in the drawings. Obviously, the connector assembly of the invention is omni-directional in use and function.

Figure 2:
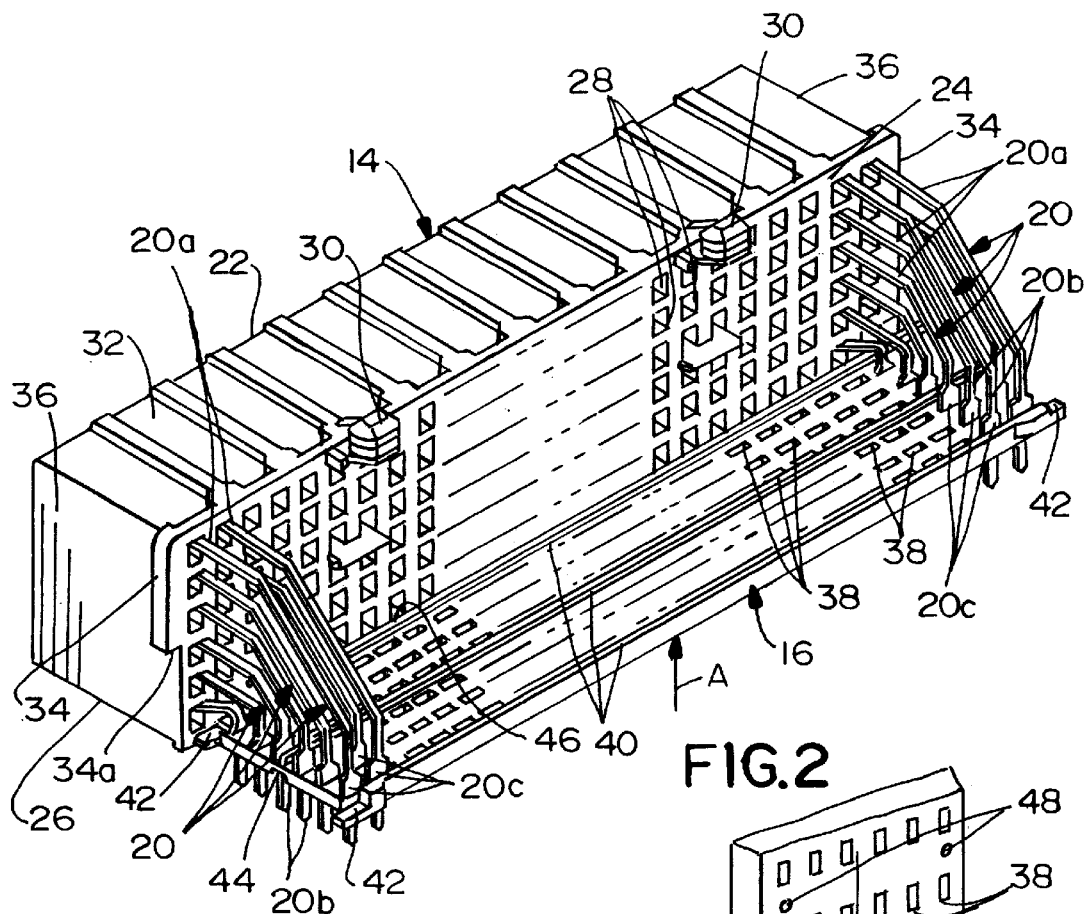
FIG. 2 is a view similar to that of FIG. 1, with the connector assembly removed from the circuit board and with the ventilating cover of the assembly removed to facilitate the illustration.

With that understanding, referring to FIG. 2 in conjunction with FIG. 1, housing 14 is elongated and includes a front mating face 22, a rear face 24 and a bottom board mounting face 26. The housing is molded of plastic material and includes a plurality of terminal-receiving passages 28 (FIG. 2) extending between front mating face 22 and rear face 24 thereof. The passages are in a plurality of rows longitudinally of the housing as seen in FIG. 2. The housing has a pair of securing bosses 30 disposed rearwardly of rear face 24 and projecting upwardly from a top face 32 of the housing, at the top rear edge of the housing as seen best in FIG. 2. A vertically oriented rib 34 projects outwardly from each opposite end face 36 of the housing near the top rear edge thereof. As seen best in FIG. 2, each rib 34 extends only partially down the height of the housing and terminates in a shoulder 34a.

Still referring to FIG. 2 in conjunction with FIG. 1, terminals 20 are of varying sizes or lengths to accommodate the varying vertical positions of their respective terminal-receiving passages 28 in housing 14. Otherwise, all of the terminals are similarly constructed in that they include contact portions extending into terminal-receiving passages 28 toward front mating face 22 of the housing. The contact portions, being disposed within passages 28, are not visible in the drawings. The contact portions are provided for engaging complementary contact portions of the terminals of a complementary mating connector (not shown). Each terminal includes a rear portion 20a projecting from rear face 24 of the housing and tail portions 20b extending at an angle to the contact portions and at an angle to rear portions 20a. Tail portions 20b extending downwardly beyond bottom board-mounting face 26 of the housing for insertion into appropriate holes in printed circuit board 12 and for connection, as by soldering, to appropriate circuit traces on the board and/or in the holes. The terminals may be stamped and formed of sheet metal material, and tail portions 20b include enlarged or widened mounting portions 20c intermediate opposite ends of the tail portions for mounting tail aligner 16, as described below.

Tail aligning device or tail aligner 16 is an elongated, rectangular plate-like structure having a plurality of rows of apertures 38 therethrough. The number of apertures and the number of rows of apertures correspond to the array of rows of terminal-receiving passages 28 in housing 14. The plate-like tail aligner may be molded of plastic material and includes three stiffening ribs 40 extending lengthwise thereof. A pair of locating tabs 42 project outwardly from each opposite end of elongated tail aligner 16 at the corners thereof. A latch recess 44 is formed in each opposite end of the tail aligner, for purposes described hereinafter.

Figure 6:
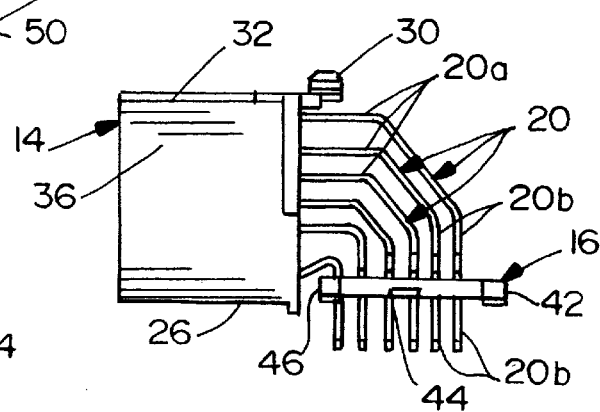
FIG. 6 is a side view of an electrical connector assembly appearing in FIG. 2.

Tail aligner 16 is mounted onto tail portions 20b of terminals 20 in the direction of arrow "A" (FIG. 2). Apertures 38 in the tail aligner are in the form of slots for receiving widened mounting portions 20c of the terminal tail portions, with a press-fit to hold the tail aligner on the tail portions. When so mounted, the tail aligner is spaced rearwardly, as at 46 (FIGS. 2 and 6), from rear face 24 of housing 14 to allow for the free passage of air therebetween. In addition, the tail aligner is mounted so that it is spaced above printed circuit board 12 with hemispherical nibs 48 (FIG. 5) located on the tail aligner 16 between the tail aligner and the printed circuit board 12 which will to allow for the free passage of air between the tail aligner and the board. Therefore, in comparing FIGS. 1, 2 and 6, it can be seen that the tail aligner is free and spaced from both printed circuit board 12 and housing 14 for the free passage of air completely around the tail aligner.

Figure 3:
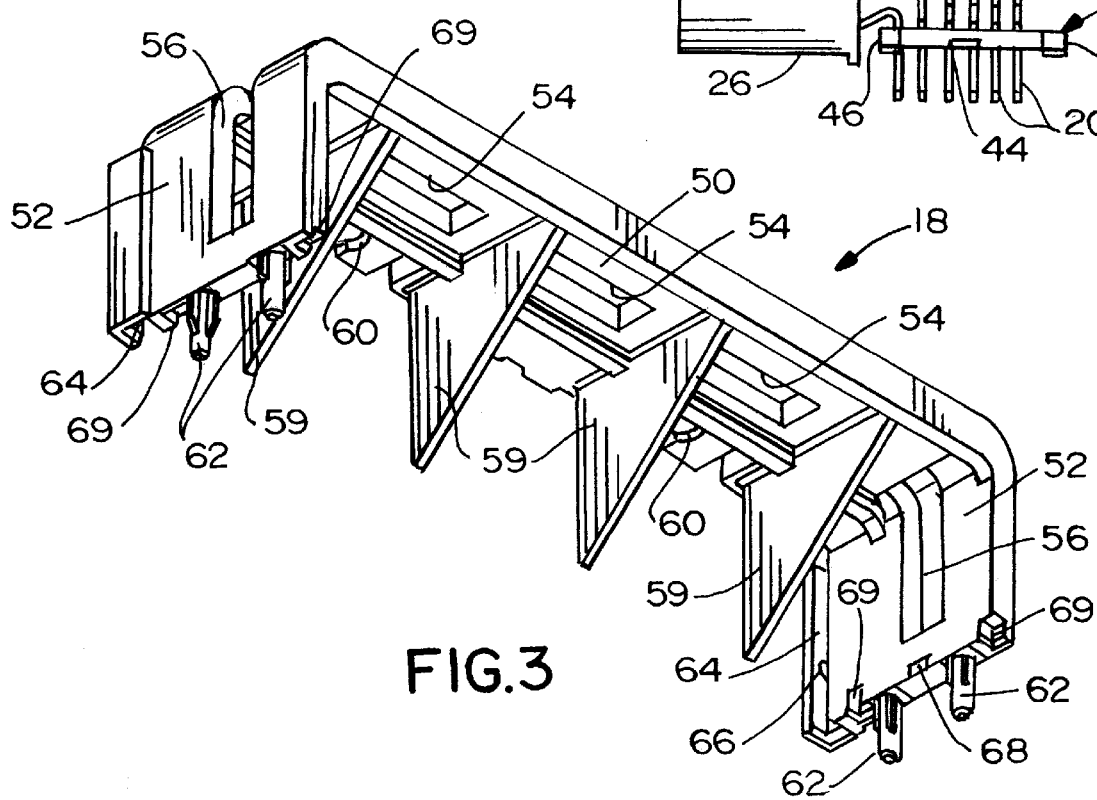
FIG. 3 is a perspective view looking toward the underside of the ventilating cover.

Referring to FIG. 3 in conjunction with FIG. 1, ventilating cover 18 is generally U-shaped in an inverted orientation when mounted in the assembly as shown in FIG. 1. The U-shaped ventilating cover defines a top bridge portion 50 and a pair of depending leg portions 52 at opposite ends of the bridge portion. The cover may be molded of plastic material. A plurality of ventilating holes 54 are formed in bridge portion 50, and a ventilating hole 56 is formed in each leg portion 52. With the rear of cover 18 being open, as at 58 (FIG. 1), free flow of air is allowed throughout the interior of the cover with the provision of ventilating holes 54 and 56. This free flow of air will also transfer heat to the terminals above the tail aligner flowing into the portion of the terminal which is inserted into holes in the printed circuit board thereby heating the solder which is located in the printed circuit board holes. A plurality of triangular flanges 59 are molded integrally with the cover for abutting rear face 24 of housing 14 for stability purposes to prevent the cover from rocking.

Still referring to FIG. 3 in conjunction with FIG. 1, bridge portion 50 of ventilating cover 16 includes a pair of securing recesses 60 in the front edge of the bridge portion. FIG. 3 shows a pair of mounting posts 62 projecting from the bottom of each leg portion 52 for insertion into appropriate mounting holes in printed circuit board 12. Each leg portion has a groove 64 on the inside thereof, and a detent latch boss 66 is formed in each groove. A chamfered latch boss 68 projects inwardly from each leg portion 52 at the bottom thereof between mounting posts 62. Finally, a plurality of locating cut-outs 69 are formed inside the bottom edges of leg portions 52.

Figure 4:
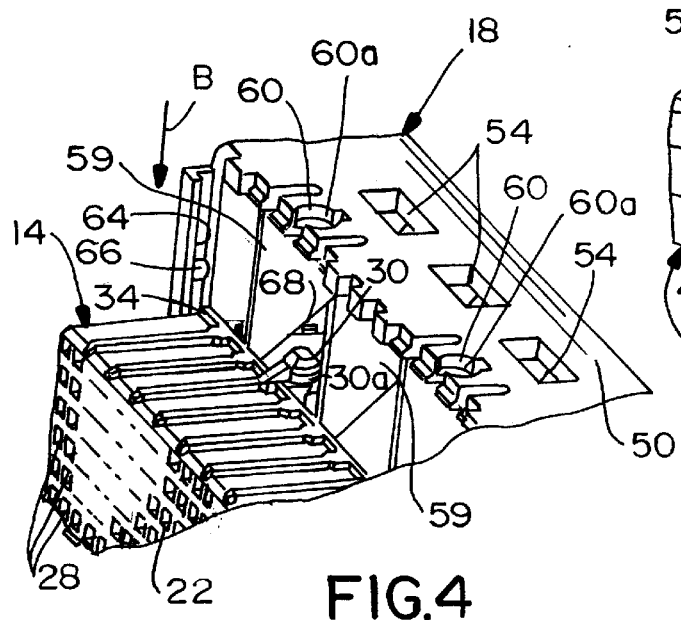
FIG. 4 is a fragmented, enlarged perspective view showing various of the securing components between the connector housing and the ventilating cover.

Referring to FIG. 4 in conjunction with FIGS. 1 and 3, ventilating cover 18 is mounted onto housing 14 in the direction of arrows "B" (FIGS. 1 and 4) after terminals 20 are mounted into housing 14 and after tail aligner 16 is mounted onto the tail portions of the terminals. The ventilating cover is slidably mounted onto the housing by positioning ribs 34 (FIG. 2) of the housing into grooves 64 of the cover as seen in FIG. 4. The cover is moved downwardly until detent latch bosses 66 (FIGS. 3 and 4) snap beneath shoulders 34a (FIG. 2) at the bottoms of ribs 34. In addition, securing bosses 30 at the top rear edge of the housing enter securing recesses 60 at the top front edge of the cover as seen best in the fully assembled depiction of FIG. 1. As seen in FIG. 4, each securing boss 30 has a projecting circumferential rib 30a which snaps behind a ledge 60a formed within securing recess 60. Therefore, top bridge portion 50 of the cover is secured to the housing by the interengagement of securing bosses 30 within securing recesses 60, and leg portions 52 of the cover are secured to the housing by the interengagement of ribs 34 of the housing within grooves 64 of the cover and the interengagement of detent latch bosses 66 within the grooves with shoulders 34a at the bottoms of the ribs.

Figure 5:
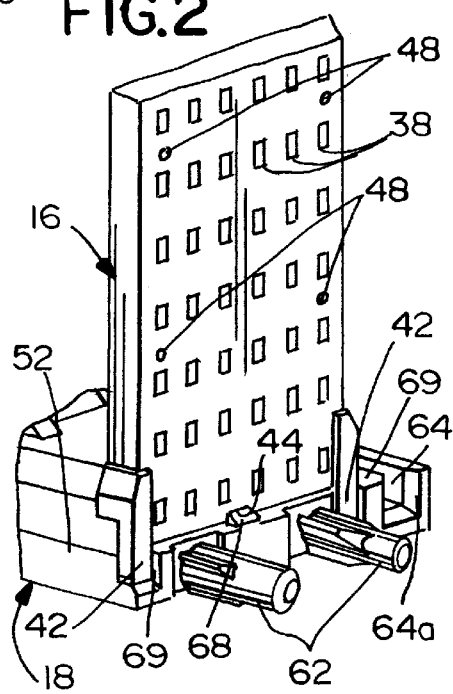
FIG. 5 is fragmented, enlarged perspective view showing the bottom of the tail aligning device at one end thereof and showing the interengaging latch means between the device and the ventilating cover.

FIG. 5 shows one of the chamfered latch bosses 68 at one end of cover 18 latched within one of the latch recesses 44 at the bottom of tail aligner 16. This secures the tail aligner to the cover. FIG. 5 also shows two of the locating bosses 42 of the tail aligner disposed in locating cutouts 69 of the cover. FIG. 5 also shows that grooves 64 in the cover have diverging mouths 64a to guide ribs 34 (FIG. 2) of the housing into the grooves and the location of nibs 48 on the bottom of the tail aligner.

In summarizing the mounting of ventilating cover 18 onto housing 14 and tail aligner 16, complementary interengaging securing means in the form of interengaging securing bosses 30 and securing recesses 60, in conjunction with the interengagement of ribs 34 within grooves 64 along with detent latch bosses 66, all hold the ventilating cover to the housing. Chamfered latch bosses 68 on the cover interengage within latch recesses 44 of the tail aligner to provide complementary interengaging latch means between the cover and the tail aligner to hold the tail aligner to the cover. Therefore, the cover performs a dual function of securing the tail aligner during processing and providing for ventilation and air flow around the tail aligner during soldering of the connector assembly to printed circuit board 12.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector assembly, comprising:
   a dielectric housing having a front mating face, a rear face and a board mounting face;
   a plurality of terminals mounted on the housing and including contact portions extending toward said front mating face, rear portions projecting from the rear face and tail portions extending at an angle to the contact portions past said board mounting face of the housing;
   a tail aligning device having a plurality of apertures through which the tail portions of the terminals extend, the tail aligning device being press-fit onto the tail portions of and being free of the housing spaced rearwardly of the rear face thereof;
   a cover at least partially enclosing the rear face of the housing and the rear portions of the terminals;
   complementary interengaging securing means between the cover and the housing to hold the cover on the housing; and
   complementary interengaging latch means between the cover and the tail aligning device to hold the tail aligning device to the cover.

2. The electrical connector assembly of claim 1 wherein said tail aligning device is located on the tail portions of the terminals above the board mounting face of the housing.

3. The electrical connector assembly of claim 1 wherein said cover is perforated to allow passage of air therethrough.

4. The electrical connector assembly of claim 1 wherein said cover is generally U-shaped in an inverted orientation to define a top bridge portion and depending leg portions at opposite ends of the bridge portion.

5. The electrical connector assembly of claim 4 wherein said cover includes holes in the bridge portion thereof to allow passage of air therethrough.

6. The electrical connector assembly of claim 4 wherein said cover includes holes in the leg portions thereof to allow passage of air therethrough.

7. The electrical connector assembly of claim 4 wherein said complementary interengaging latch means are between the leg portions of the cover and opposite ends of the tail aligning device.

8. The electrical connector assembly of claim 4 wherein said complementary interengaging securing means include complementary interengaging securing components between the bridge portion of the cover and the housing.

9. The electrical connector assembly of claim 4 wherein said complementary interengaging securing means include complementary interengaging securing components between the leg portions of the cover and the housing.

10. The electrical connector assembly of claim 9 wherein said securing components include complementary interengaging rib-and-groove means for slidably mounting the cover onto the housing.

11. The electrical connector assembly of claim 10 wherein said rib-and-groove means include a detent latch boss in a groove engageable with a detent latch shoulder on a rib.

12. An electrical connector assembly, comprising:
    a dielectric housing having a front mating face, a rear face and a board mounting face;
    a plurality of terminals mounted on the housing and including contact portions extending toward said front mating face, rear portions projecting from the rear face and tail portions extending at an angle to the contact portions past said board mounting face of the housing;
    a tail aligning device having a plurality of apertures through which the tail portions of the terminals extend, the tail aligning device being located on the tail portions of the terminals above the board mounting face of the housing and being free of the housing spaced rearwardly of the rear face thereof;
    a perforated cover at least partially enclosing the rear face of the housing and the rear portions of the terminals, the cover being generally U-shaped in an inverted orientation to define a top bridge portion and depending leg portions at opposite ends of the bridge portion;
    complementary interengaging securing means between the cover and the housing to hold the cover on the housing; and
    complementary interengaging latch means between the cover and the tail aligning device to hold the tail aligning device to the cover.

13. The electrical connector assembly of claim 12 wherein said cover includes holes in the bridge portion thereof to allow passage of air therethrough.

14. The electrical connector assembly of claim 12 wherein said cover includes holes in the leg portions thereof to allow passage of air therethrough.

15. The electrical connector assembly of claim 12 wherein said complementary interengaging latch means are between the leg portions of the cover and opposite ends of the tail aligning device.

16. The electrical connector assembly of claim 12 wherein said complementary interengaging securing means include complementary interengaging securing components between the bridge portion of the cover and the housing.

17. The electrical connector assembly of claim 12 wherein said complementary interengaging securing means include complementary interengaging securing components between the leg portions of the cover and the housing.

18. The electrical connector assembly of claim 17 wherein said securing components include complementary interengaging rib-and-groove means for slidably mounting the cover onto the housing.

19. The electrical connector assembly of claim 18 wherein said rib-and-groove means include a detent latch boss in a groove engageable with a detent latch shoulder on a rib.

20. An electrical connector assembly, comprising:

- a dielectric housing having a front mating face, a rear face and a board mounting face;
- a plurality of terminals mounted on the housing and including contact portions extending toward said front mating face, rear portions projecting from the rear face and tail portions extending at an angle to the contact portions for connecting to circuit traces on the printed circuit board;
- a tail aligning device having a plurality of apertures through which the tail portions of the terminals extend, the tail aligning device being free of the housing; and
- a cover at least partially enclosing the rear face of the housing and the rear portions of the terminals, the cover being secured to the housing to hold the cover on the housing and being latched to the tail aligning device to hold the tail aligning device to the cover.

21. The electrical connector assembly of claim 20 wherein said cover is perforated to allow the passage of air therethrough.

22. The electrical connector assembly of claim 20 wherein said cover is generally U-shaped in an inverted orientation to define a top bridge portion and depending leg portions at opposite ends of the bridge portion.

23. The electrical connector assembly of claim 22 wherein said cover includes holes in the bridge portion thereof to allow passage of air therethrough.

24. The electrical connector assembly of claim 22 wherein said cover includes holes in the leg portions thereof to allow passage of air therethrough.

25. The electrical connector assembly of claim 22, including complementary interengaging securing means between the bridge portion of the cover and the housing.

26. The electrical connector assembly of claim 22, including complementary interengaging securing means between the leg portions of the cover and the housing.

* * * * *